US009741799B2

(12) United States Patent
Hiyoshi et al.

(10) Patent No.: US 9,741,799 B2
(45) Date of Patent: Aug. 22, 2017

(54) SILICON CARBIDE SEMICONDUCTOR DEVICE AND METHOD FOR MANUFACTURING THE SAME

(71) Applicant: Sumitomo Electric Industries, Ltd., Osaka-shi (JP)

(72) Inventors: Toru Hiyoshi, Osaka (JP); Taku Horii, Osaka (JP); Takeyoshi Masuda, Osaka (JP); Shunsuke Yamada, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 8 days.

(21) Appl. No.: 15/023,987

(22) PCT Filed: Aug. 5, 2014

(86) PCT No.: PCT/JP2014/070557
§ 371 (c)(1),
(2) Date: Mar. 22, 2016

(87) PCT Pub. No.: WO2015/045626
PCT Pub. Date: Apr. 2, 2015

(65) Prior Publication Data
US 2016/0218188 A1    Jul. 28, 2016

(30) Foreign Application Priority Data

Sep. 25, 2013   (JP) ................. 2013-198198

(51) Int. Cl.
*H01L 29/78*     (2006.01)
*H01L 21/336*    (2006.01)
(Continued)

(52) U.S. Cl.
CPC ........ *H01L 29/1608* (2013.01); *H01L 21/049* (2013.01); *H01L 21/28247* (2013.01);
(Continued)

(58) Field of Classification Search
CPC .......... H01L 29/1608; H01L 29/66068; H01L 29/02529; H01L 29/0223–29/02238;
(Continued)

(56) References Cited

U.S. PATENT DOCUMENTS 5,907,188 A * 5/1999 Nakajima ......... H01L 21/28247
257/412
6,162,741 A * 12/2000 Akasaka ........... H01L 21/28061
257/E21.2
(Continued)

FOREIGN PATENT DOCUMENTS

JP    2003-224277 A    8/2003
JP    2003-243653 A    8/2003
(Continued)

OTHER PUBLICATIONS

Grieb et al., "Comparison of the threshold-voltage stability of SiC MOSFETs with thermally grown and deposited gate oxides," Materials Science Forum, vols. 645-648 (2010) pp. 681-684.
(Continued)

*Primary Examiner* — Marvin Payen
*Assistant Examiner* — Jeremy Joy
(74) *Attorney, Agent, or Firm* — Venable LLP; Michael A. Sartori; F. Brock Riggs

(57) ABSTRACT

A silicon carbide semiconductor device includes a silicon carbide semiconductor layer, a gate insulating film formed on the silicon carbide semiconductor layer, and a gate electrode provided on the gate insulating film, wherein the gate electrode has a polysilicon layer at least on a side of an interface with the gate insulating film, and the gate insulating film has an oxide film derived from the polysilicon layer, at an interface between the gate insulating film and the polysilicon layer of the gate electrode.

11 Claims, 9 Drawing Sheets

(51) Int. Cl.
    *H01L 29/16*     (2006.01)
    *H01L 21/28*     (2006.01)
    *H01L 21/04*     (2006.01)
    *H01L 29/66*     (2006.01)
    *H01L 29/49*     (2006.01)
    *H01L 29/51*     (2006.01)
    *H01L 29/423*    (2006.01)
    *H01L 29/739*    (2006.01)

(52) U.S. Cl.
    CPC .... *H01L 29/4236* (2013.01); *H01L 29/42364* (2013.01); *H01L 29/4916* (2013.01); *H01L 29/513* (2013.01); *H01L 29/66068* (2013.01); *H01L 29/7395* (2013.01); *H01L 29/7397* (2013.01); *H01L 29/7802* (2013.01); *H01L 29/7813* (2013.01)

(58) Field of Classification Search
    CPC ......... H01L 29/02255; H01L 29/02378; H01L 21/049; H01L 21/28247
    See application file for complete search history.

(56) References Cited

U.S. PATENT DOCUMENTS

| | | | | |
|---|---|---|---|---|
| 6,919,235 | B1* | 7/2005 | Yamazaki | H01L 21/0237 257/E21.133 |
| 7,402,467 | B1* | 7/2008 | Kadono | H01L 27/1214 257/E21.413 |
| 2002/0068406 | A1* | 6/2002 | Ishii | H01L 21/76243 438/275 |
| 2003/0107041 | A1* | 6/2003 | Tanimoto | H01L 29/66068 257/77 |
| 2008/0108190 | A1* | 5/2008 | Matocha | H01L 21/0465 438/197 |
| 2008/0203441 | A1* | 8/2008 | Endo | H01L 21/049 257/255 |
| 2010/0006860 | A1* | 1/2010 | Roedle | H01L 29/66068 257/77 |
| 2011/0297963 | A1* | 12/2011 | Honaga | H01L 21/049 257/77 |
| 2012/0007104 | A1* | 1/2012 | Wada | H01L 21/0485 257/77 |
| 2012/0241767 | A1* | 9/2012 | Yano | H01L 21/049 257/77 |
| 2012/0248461 | A1* | 10/2012 | Masuda | H01L 21/3065 257/77 |
| 2013/0161619 | A1* | 6/2013 | Wada | H01L 29/7393 257/52 |
| 2013/0341643 | A1* | 12/2013 | Kudou | H01L 29/66068 257/77 |
| 2015/0079747 | A1* | 3/2015 | Jung | H01L 21/02104 438/270 |
| 2015/0236151 | A1* | 8/2015 | McMahon | H01L 29/7827 257/77 |

FOREIGN PATENT DOCUMENTS

| | | | |
|---|---|---|---|
| JP | 2006080273 A | * | 3/2006 |
| JP | 2006-173642 A | | 6/2006 |
| JP | 2009-253072 A | | 10/2009 |
| JP | 2009253072 A | * | 10/2009 |
| JP | 2010-186905 A | | 8/2010 |
| JP | 2011-165941 A | | 8/2011 |
| JP | 2012-054505 A | | 3/2012 |

OTHER PUBLICATIONS

International Search Report in International Application No. PCT/JP2014/070557, dated Nov. 11, 2014.

* cited by examiner

SILICON CARBIDE SEMICONDUCTOR DEVICE AND METHOD FOR MANUFACTURING THE SAME

TECHNICAL FIELD

The present invention relates to a silicon carbide semiconductor device.

BACKGROUND ART

Silicon carbide (hereinafter also referred to as "SiC") has attracted attention as a material for next-generation power semiconductor devices. In particular, in recent years, development of MOSFETs (Metal Oxide Semiconductor Field Effect Transistors) using SiC, which are promising as switching elements, has been actively performed (see, for example, NPD 1).

CITATION LIST

Non Patent Document

NPD 1: M. Grieb et al., "Comparison of the threshold-voltage stability of SiC MOSFETs with thermally grown and deposited gate oxides", Materials Science Forum Vols. 645-648 (2010) pp. 681-684

SUMMARY OF INVENTION

Technical Problem

While practical use of silicon carbide semiconductor devices has been promoted in recent years, some problems have become noticeable. Among them, variation in threshold voltage as indicated for example in NPD 1 is especially an urgent problem. Studies conducted so far have suggested that a fixed charge and movable ions are likely to exist at an oxide film obtained by oxidizing SiC and an interface between the oxide film and a SiC semiconductor layer, and they affect the stability of the threshold voltage. However, an effective method for stabilizing the threshold voltage in a silicon carbide semiconductor device has not been developed yet.

Thus, in view of the aforementioned problem, one object of the present invention is to provide a silicon carbide semiconductor device having a stable threshold voltage.

Solution to Problem

A silicon carbide semiconductor device in accordance with one aspect of the present invention includes a silicon carbide semiconductor layer, a gate insulating film formed on the silicon carbide semiconductor layer, and a gate electrode provided on the gate insulating film, wherein the gate electrode has a polysilicon layer at least on a side of an interface with the gate insulating film, and the gate insulating film has an oxide film derived from the polysilicon layer, at an interface between the gate insulating film and the polysilicon layer of the gate electrode.

Advantageous Effects of Invention

According to the above configuration, a silicon carbide semiconductor device having a stable threshold voltage can be provided.

DESCRIPTION OF EMBODIMENTS

Figure 1:
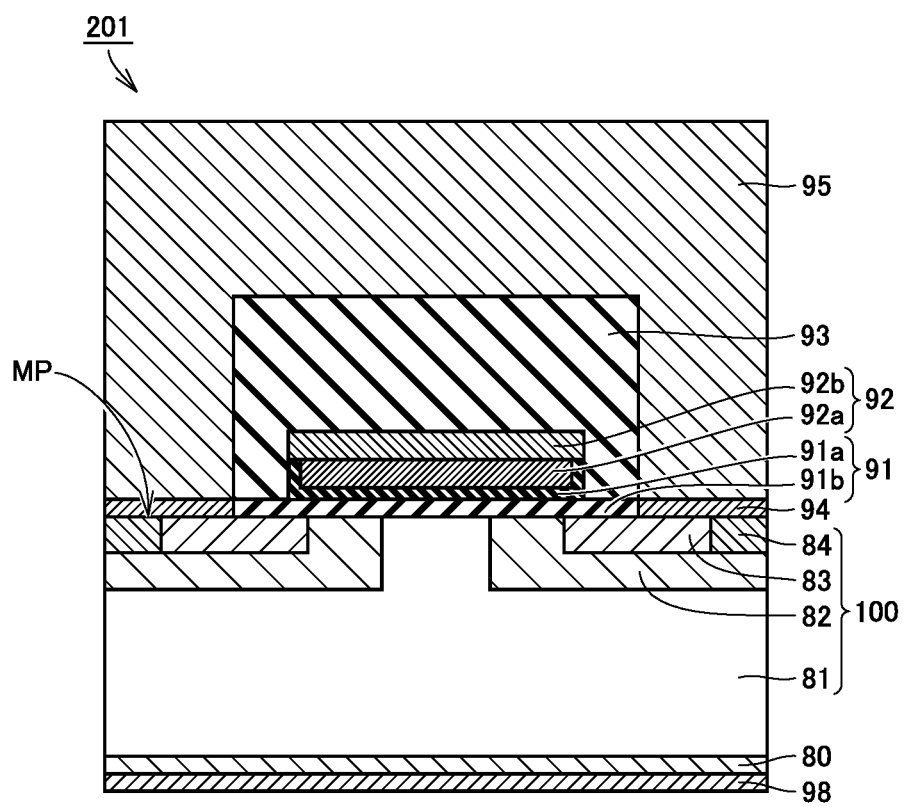
FIG. 1 is a cross sectional view schematically showing an example of a configuration of a silicon carbide semiconductor device in one embodiment of the present invention.

Next, one embodiment of the present invention will be described in more detail. It should be noted that, in the below-mentioned drawings, the same or corresponding portions are given the same reference characters and are not described repeatedly. Further, regarding crystallographic indications in the present specification, an individual orientation is represented by [ ], a group orientation is represented by < >, an individual plane is represented by ( ), and a group plane is represented by { }. In addition, a negative crystallographic index is normally expressed by putting "–" (bar) above a numeral, but is expressed by putting the negative sign before the numeral in the present specification.

DESCRIPTION OF EMBODIMENT OF THE INVENTION OF THE PRESENT APPLICATION

First, a summary of one embodiment of the invention of the present application (hereafter also referred to as the "present embodiment") will be described, as listed below in (1) to (15).

As a result of earnest studies to solve the aforementioned problem, the inventor of the present invention obtained a finding that a silicon carbide semiconductor device has many dangling bonds in an interface region between a gate electrode and a gate insulating film, and an impurity which becomes movable ions is trapped by the dangling bonds, resulting in an unstable threshold voltage. Based on that finding, the inventor of the present invention conducted further studies, and thereby completed the present embodiment. That is, a silicon carbide semiconductor device in accordance with the present embodiment includes the following configuration.

(1) The silicon carbide semiconductor device includes a silicon carbide semiconductor layer 100, a gate insulating film 91 formed on silicon carbide semiconductor layer 100, and a gate electrode 92 provided on gate insulating film 91, wherein gate electrode 92 has a polysilicon layer 92a at least on a side of an interface with gate insulating film 91, and gate insulating film 91 has an oxide film 91a derived from polysilicon layer 92a, at an interface between gate insulating film 91 and polysilicon layer 92a of gate electrode 92.

Conventionally, a gate insulating film is formed by thermally oxidizing a silicon carbide semiconductor layer. However, many dangling bonds exist at an interface between the gate insulating film derived from the silicon carbide semiconductor layer and a gate electrode. Due to the existence of the dangling bonds, an impurity is likely to accumulate at the interface between the gate insulating film and the gate electrode.

According to the present embodiment, the silicon carbide semiconductor device can form the oxide film derived from polysilicon layer 92a in an interface region between gate electrode 92 and gate insulating film 91. That is, dangling bonds at an interface between oxide film 91a and polysilicon layer 92a can be reduced. Therefore, an impurity is less likely to be trapped in that region, and thus a silicon carbide semiconductor device having a stable threshold voltage can be provided.

(2) Preferably, oxide film 91a has a thickness of less than or equal to 50 nm. In the present embodiment, oxide film 91a is derived from polysilicon layer 92a constituting a portion of gate electrode 92. When silicon is oxidized, its volume becomes double the original volume. Accordingly, when the thickness of oxide film 91a to be formed is more than 50 nm, it may be difficult to control the thickness of oxide film 91a. When the thickness of oxide film 91a is less than or equal to 50 nm, oxide film 91a having a desired thickness can be formed, and a silicon carbide semiconductor device having a stable threshold voltage can be obtained.

(3) Preferably, gate electrode 92 is constituted of polysilicon layer 92a. According to such an aspect, oxide film 91a derived from polysilicon layer 92a can be easily formed at the interface between gate insulating film 91 and gate electrode 92, by thermally oxidizing gate electrode 92.

(4) Preferably, oxide film 91a extends onto a side surface and an upper surface of gate electrode 92. Thereby, when an interlayer insulating film 93 covering gate electrode 92 is formed, dangling bonds at an interface between gate electrode 92 and interlayer insulating film 93 can be reduced in the silicon carbide semiconductor device. Therefore, accumulation of an impurity is further reduced and reliability can be improved in the silicon carbide semiconductor device.

(5) Preferably, silicon carbide semiconductor layer 100 has a main surface MP, and includes a first impurity region 81 having a first conductivity type, a second impurity region 82 provided within first impurity region 81 and having a second conductivity type different from the first conductivity type, and a third impurity region 83 constituting a portion of main surface MP, provided within second impurity region 82, and having the first conductivity type, main surface MP is provided with a trench TR in which second impurity region 82 and third impurity region 83 are exposed at a sidewall SW, and gate insulating film 91 is formed on sidewall SW.

Thereby, a silicon carbide semiconductor device having a trench gate structure and having a stable threshold voltage can be achieved.

(6) Preferably, silicon carbide semiconductor layer 100 has main surface MP, and includes first impurity region 81 constituting a portion of main surface MP and having a first conductivity type, second impurity region 82 constituting a portion of main surface MP, provided within first impurity region 81, and having a second conductivity type different from the first conductivity type, and third impurity region 83 constituting a portion of main surface MP, provided within second impurity region 82, and having the first conductivity type, and gate insulating film 91 is formed on main surface MP constituted of second impurity region 82.

Thereby, a silicon carbide semiconductor device having a planar structure and having a stable threshold voltage can be achieved.

(7) Preferably, sodium concentration in a region within 10 nm from the interface between gate electrode 92 and gate insulating film 91 (oxide film 91a) is less than or equal to $1\times10^{16}/cm^3$. According to the studies of the inventor of the present invention, sodium (Na) is an impurity which becomes movable ions particularly easily. In addition, when the sodium concentration in gate insulating film 91 is more than $1\times10^{16}/cm^3$, the threshold voltage tends to become unstable. Therefore, the stability of the threshold voltage can be further improved by limiting the sodium concentration in that region to less than or equal to $1\times10^{16}/cm^3$.

(8) Preferably, nitrogen concentration in a region within 10 nm from an interface between silicon carbide semiconductor layer 100 and gate insulating film 91 (an underlying insulating film 91b) is more than or equal to $1\times10^{21}/cm^3$. Thereby, dangling bonds can also be reduced at the interface between silicon carbide semiconductor layer 100 and gate insulating film 91, and accumulation of an impurity can be suppressed. Therefore, the threshold voltage can be further stabilized.

(9) According to another aspect of the present embodiment, a silicon carbide semiconductor device includes silicon carbide semiconductor layer 100, gate insulating film 91 formed on silicon carbide semiconductor layer 100, and gate electrode 92 provided on gate insulating film 91, wherein sodium concentration in gate insulating film 91 is less than or equal to $1\times10^{16}/cm^3$.

By limiting the concentration of sodium which may cause variation in threshold voltage in gate insulating film 91 as described above, a silicon carbide semiconductor device having a stable threshold voltage can be provided.

(10) Preferably, in the silicon carbide semiconductor device according to the other aspect of the present embodiment, sodium concentration in a region within 10 nm from an interface between gate electrode 92 and gate insulating film 91 (oxide film 91a) is less than or equal to $1\times10^{16}/cm^3$. The region within 10 nm from the interface between gate electrode 92 and gate insulating film 91 is a region where an impurity is particularly likely to accumulate. Therefore, by limiting the sodium concentration in that region, the threshold voltage can be further stabilized.

(11) Preferably, in the silicon carbide semiconductor device according to the other aspect of the present embodiment, silicon carbide semiconductor layer 100 has main surface MP, and includes first impurity region 81 having a first conductivity type, second impurity region 82 provided within first impurity region 81 and having a second conductivity type different from the first conductivity type, and third impurity region 83 constituting a portion of main surface MP, provided within second impurity region 82, and having the first conductivity type, main surface MP is provided with trench TR in which second impurity region 82 and third impurity region 83 are exposed at sidewall SW, and gate insulating film 91 is formed on sidewall SW.

Thereby, a silicon carbide semiconductor device having a trench gate structure and having the sodium concentration in gate insulating film 91 of less than or equal to $1\times10^{16}/cm^3$ can be achieved.

(12) Preferably, in the silicon carbide semiconductor device according to the other aspect of the present embodiment, silicon carbide semiconductor layer 100 has main surface MP, and includes first impurity region 81 constituting a portion of main surface MP and having a first conductivity type, second impurity region 82 constituting a portion of main surface MP, provided within first impurity region 81, and having a second conductivity type different from the first conductivity type, and third impurity region 83 constituting a portion of main surface MP, provided within second impurity region 82, and having the first conductivity type, and gate insulating film 91 is formed on main surface MP constituted of second impurity region 82.

Thereby, a silicon carbide semiconductor device having a planar structure and having the sodium concentration in gate insulating film 91 of less than or equal to $1\times10^{16}/cm^3$ can be achieved.

(13) The silicon carbide semiconductor device in the present embodiment can be manufactured by a manufacturing method as described below. That is, a method for manufacturing the silicon carbide semiconductor device in the present embodiment includes a step S1 of preparing silicon carbide semiconductor layer 100, a step S2 of forming underlying insulating film 91b constituting gate insulating film 91 on silicon carbide semiconductor layer 100, a step S4 of providing gate electrode 92 on underlying insulating film 91b, and a step S5 of forming oxide film 91a derived from gate electrode 92 and constituting gate insulating film 91, at least at an interface between underlying insulating film 91b and gate electrode 92, by heat-treating gate electrode 92 in an oxygen-containing atmosphere.

According to the manufacturing method described above, the silicon carbide semiconductor device in the present embodiment in which dangling bonds are reduced at the interface between gate electrode 92 and gate insulating film 91 and which has a stable threshold voltage can be easily manufactured.

(14) Preferably, in step S4 of providing the gate electrode, gate electrode 92 is provided to have polysilicon layer 92a at least at an interface with gate insulating film 91. Thereby, oxide film 91a can be easily formed at the interface between underlying insulating film 91b and gate electrode 92 in step S5.

(15) Preferably, the method for manufacturing the silicon carbide semiconductor device described above further includes a step S3 of introducing at least one of nitrogen and phosphorus into an interface between silicon carbide semiconductor layer 100 and underlying insulating film 91b. Thereby, a silicon carbide semiconductor device in which dangling bonds are also reduced at the interface between gate insulating film 91 and silicon carbide semiconductor layer 100 and which has a further stable threshold voltage can be manufactured.

Details of Embodiment of the Invention of the Present Application

Hereinafter, the silicon carbide semiconductor device in accordance with the present embodiment will be described in more detail. However, the present embodiment is not limited thereto.

<Silicon Carbide Semiconductor Device>

A silicon carbide semiconductor device 201 in accordance with the present embodiment shown in FIG. 1 is configured as a vertical MOSFET having a planar structure. Silicon carbide semiconductor device 201 has a single crystal substrate 80, silicon carbide semiconductor layer 100 (an epitaxial layer), gate insulating film 91, gate electrode 92, interlayer insulating film 93, a source electrode 94, a source interconnection layer 95, and a drain electrode 98.

Gate insulating film 91 is formed on silicon carbide semiconductor layer 100, and is constituted of underlying insulating film 91b and oxide film 91a. Preferably, underlying insulating film 91b is a silicon oxide film ($SiO_2$). Further, gate electrode 92 is formed on gate insulating film 91. Gate electrode 92 has a lamination structure including polysilicon layer 92a and an electrode layer 92b. Electrode layer 92b is made of a conductor such as aluminum (Al), for example. Polysilicon layer 92a is located on a side of an interface with gate insulating film 91 (oxide film 91a). That is, silicon carbide semiconductor device 201 has oxide film 91a at the interface between gate insulating film 91 and polysilicon layer 92a. Oxide film 91a is an oxide film derived from polysilicon layer 92a. Specifically, oxide film 91a is a silicon oxide film formed by thermally oxidizing a portion of polysilicon layer 92a. Therefore, oxide film 91a is a very clean film, and has very few dangling bonds therein. Further, oxide film 91a is integrated with underlying insulating film 91b to constitute gate insulating film 91, which insulates gate electrode 92 from silicon carbide semiconductor layer 100 (a channel region).

By providing oxide film 91a obtained by thermally oxidizing polysilicon at the interface between gate insulating film 91 and gate electrode 92 (polysilicon layer 92a) as described above, accumulation of an impurity which may cause variation in threshold voltage can be prevented in that region.

Here, examples of the impurity which may cause variation in threshold voltage can include sodium (Na), potassium (K), calcium (Ca), iron (Fe), nickel (Ni), copper (Cu), zinc (Zn), and the like. When these impurities are contained in the gate insulating film, they become movable ions and move in the film depending on the temperature or the electric field, and thus they are thought to cause a shift of the threshold voltage. In particular, Na easily becomes movable ions, and largely affects the threshold voltage. Therefore, from the viewpoint of more stabilizing the threshold voltage, Na concentration in a region within 10 nm from an interface between gate electrode 92 and oxide film 91a as a portion of gate insulating film 91 is preferably less than or equal to $1\times10^{16}/cm^3$. In the present embodiment, the Na concentration in that region can be easily set to less than or equal to $1\times10^{16}/cm^3$, for example by setting the thickness of oxide film 91a to approximately 10 nm.

Here, it is known that a thermally oxidized silicon film obtained by thermally oxidizing polysilicon has a volume approximately double that of original polysilicon. As described above, oxide film 91a is integrated with underlying insulating film 91b, and constitutes a portion of gate insulating film 91. Accordingly, when oxide film 91a is excessively thick, the variation amount of the film thickness of gate insulating film 91 is increased, which is not preferable. From such a viewpoint, the thickness of oxide film 91a is preferably less than or equal to 50 nm. It should be noted that the thickness of oxide film 91a is preferably more than or equal to 5 nm and less than or equal to 50 nm, more preferably more than or equal to 5 nm and less than or equal to 40 nm, and particularly preferably more than or equal to 10 nm and less than or equal to 30 nm.

As described above, in the present embodiment, accumulation of an impurity is prevented at the interface between gate electrode 92 and gate insulating film 91, and thus the threshold voltage is stabilized. In addition thereto, in the present embodiment, accumulation of an impurity can also be prevented at an interface between gate insulating film 91 and silicon carbide semiconductor layer 100.

That is, by introducing at least one of nitrogen (N) and phosphorus (P) into the interface between silicon carbide semiconductor layer 100 and gate insulating film 91 (underlying insulating film 91b), dangling bonds can be reduced also in that region, and accumulation of an impurity can be prevented. Specifically, nitrogen and phosphorus are preferably introduced such that at least one of nitrogen concentration and phosphorus concentration in a region within 10 nm from the interface between silicon carbide semiconductor layer 100 and gate insulating film 91 is more than or equal to $1\times10^{21}/cm^3$.

Further, according to such an aspect, accumulation of an impurity is prevented in a region from gate electrode 92 through gate insulating film 91 to silicon carbide semiconductor layer 100. That is, it is also possible to set an impurity concentration (Na concentration) in gate insulating film 91 to less than or equal to $1\times10^{16}/cm^3$. Thus, when the impurity concentration (Na concentration) in gate insulating film 91 is less than or equal to $1\times10^{16}/cm^3$, a silicon carbide semiconductor device having a further stabilized threshold voltage can be achieved.

Furthermore, from the viewpoint of reducing dangling bonds, hydrogen (H) may be introduced into the interface between silicon carbide semiconductor layer 100 and gate insulating film 91 (underlying insulating film 91b). That is, at least one of nitrogen concentration, phosphorus concentration, and hydrogen concentration in the region within 10 nm from the interface between silicon carbide semiconductor layer 100 and gate insulating film 91 may be more than or equal to $1\times10^{21}/cm^3$.

It should be noted that the Na concentration, the nitrogen concentration, the phosphorus concentration, and the hydrogen concentration in interface regions and the like described above can be measured, for example, with a secondary ion mass spectrometer (SIMS).

Hereinafter, other components of silicon carbide semiconductor device 201 will be described. It should be noted that the conductivity type of each layer or region described in the following is merely exemplary, and each layer or region may have a conductivity type different therefrom.

Single crystal substrate 80 is made of SiC, and has n type (a first conductivity type). Silicon carbide semiconductor layer 100 is provided on single crystal substrate 80.

Silicon carbide semiconductor layer 100 is a SiC layer epitaxially grown on single crystal substrate 80. Preferably, silicon carbide semiconductor layer 100 has a hexagonal crystal structure having a polytype of 4H, because on-resistance of silicon carbide semiconductor device 201 can be reduced by adopting such a crystal structure. Silicon carbide semiconductor layer 100 has a lower surface facing single crystal substrate 80, and main surface MP which is an upper surface opposite to the lower surface. Further, silicon carbide semiconductor layer 100 includes an n drift layer 81 (the first impurity region), a p body layer 82 (the second impurity region), an n+ layer 83 (the third impurity region), and a p contact region 84.

N drift layer 81 is provided on single crystal substrate 80, and has n type (the first conductivity type). N drift layer 81 includes a JFET (Junction Field Effect Transistor) region in a region sandwiched between a pair of p body layers 82. Further, an upper end of the JFET region constitutes a portion of main surface MP, and is in contact with gate insulating film 91 (underlying insulating film 91b). That is, gate insulating film 91 is formed on main surface MP constituted of n drift layer 81 (the first impurity region). N drift layer 81 preferably has an impurity concentration lower than that of single crystal substrate 80. The impurity concentration of n drift layer 81 is, for example, more than or equal to $1\times10^{15}/cm^3$ and less than or equal to $5\times10^{16}/cm^3$.

P body layer 82 is provided within n drift layer 81, and has p type (a second conductivity type different from the first conductivity type). P body layer 82 constitutes a portion of main surface MP, and is in contact with gate insulating film 91 (underlying insulating film 91b) at that portion. That is, gate insulating film 91 is formed on main surface MP constituted of p body layer 82 (the second impurity region). Further, a channel region is formed along the portion in contact with gate insulating film 91. The impurity concentration of p body layer 82 is preferably more than or equal to $5\times10^{15}/cm^3$ and less than or equal to $2\times10^{18}/cm^3$, and can be set, for example, to approximately $1\times10^{18}/cm^3$.

N+ layer 83 is provided within p body layer 82, has n type (the first conductivity type), and serves as a source region. N+ layer 83 constitutes a portion of main surface MP. Further, p contact region 84 is formed on p body layer 82 to be adjacent to n+ layer 83. P contact region 84 has p type conductivity type, and constitutes a portion of main surface MP.

Source electrode 94 is formed on main surface MP, and is in contact with each of n+ layer 83 and p contact region 84. Interlayer insulating film 93 is provided on gate electrode 92 to cover gate electrode 92, and insulates gate electrode 92 from source electrode 94. Source interconnection layer 95 is formed in contact with interlayer insulating film 93 and source electrode 94. Source interconnection layer 95 is made of a conductor such as Al, for example. Drain electrode 98 is provided on the lower surface of silicon carbide semiconductor layer 100 opposite to main surface MP, with single crystal substrate 80 interposed therebetween.

As described above, silicon carbide semiconductor device 201 is a MOSFET having a planar structure, and is a silicon carbide semiconductor device having a stable threshold voltage. In addition, according to the studies of the inventor of the present invention, among devices having the same configuration as that of silicon carbide semiconductor device 201, a device having the following configuration has a particularly stable threshold voltage.

That is, according to another aspect of the present embodiment, a silicon carbide semiconductor device includes silicon carbide semiconductor layer 100, gate insulating film 91 formed on silicon carbide semiconductor layer 100, and gate electrode 92 provided on gate insulating film 91, wherein sodium concentration in gate insulating film 91 is less than or equal to $1 \times 10^{16}/cm^3$.

<Method for Manufacturing Silicon Carbide Semiconductor Device>

Figure 16:
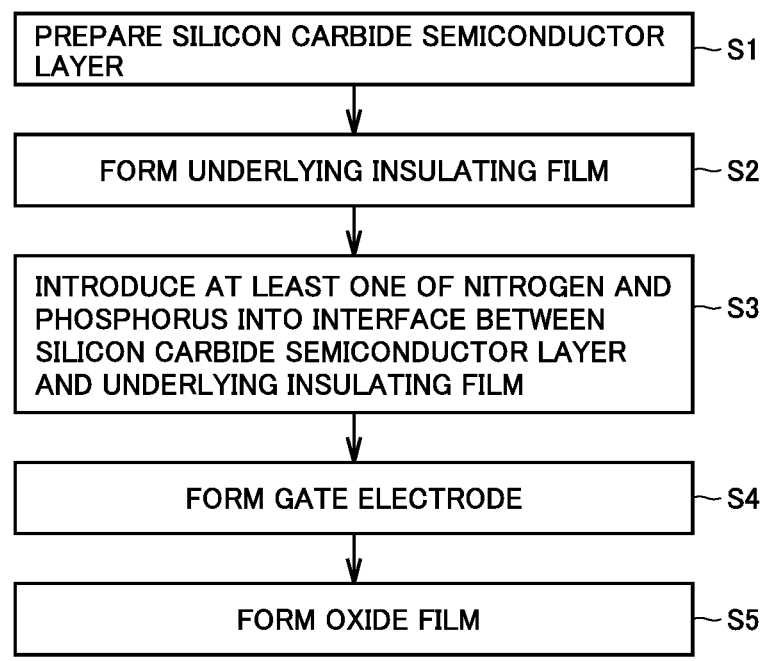
FIG. 16 is a flowchart schematically showing a method for manufacturing the silicon carbide semiconductor device in one embodiment of the present invention.

The silicon carbide semiconductor device in accordance with the present embodiment described above can be manufactured by a manufacturing method described below. FIG. 16 is a flowchart schematically showing a method for manufacturing the silicon carbide semiconductor device in accordance with the present embodiment. As shown in FIG. 16, the manufacturing method includes step S1, step S2, step S4, and step S5, and preferably further includes step S3 after step S2. Hereinafter, each step will be described.

(Step S1)

In step S1, silicon carbide semiconductor layer 100 is prepared. Silicon carbide semiconductor layer 100 is prepared, for example, by epitaxial growth on single crystal substrate 80 and ion implantation.

Figure 4:
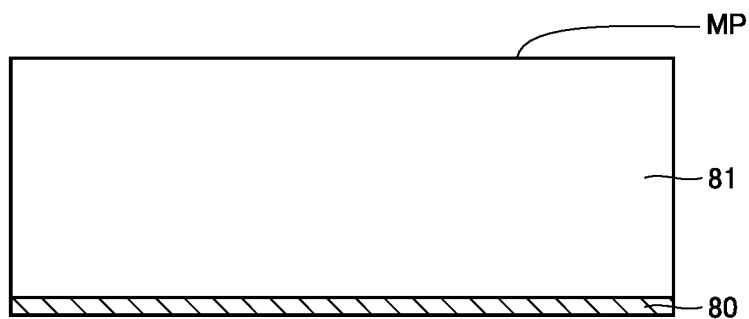
FIG. 4 is a cross sectional view schematically showing a portion of a process for manufacturing the silicon carbide semiconductor device in one embodiment of the present invention.

Referring to FIG. 4, n drift layer 81 to be a portion of silicon carbide semiconductor layer 100 is formed on single crystal substrate 80 by epitaxial growth. Here, single crystal substrate 80 can be obtained by slicing an ingot (not shown) made of, for example, hexagonal silicon carbide having a polytype of 4H. The epitaxial growth of n drift layer 81 can be performed by a CVD (Chemical Vapor Deposition) method that uses a mixed gas of silane ($SiH_4$) and propane ($C_3H_8$), for example, as a source gas, and uses hydrogen gas ($H_2$), for example, as a carrier gas. On this occasion, it is preferable to introduce nitrogen (N) or phosphorus (P), for example, as an impurity. An upper surface of n drift layer 81 obtained as described above serves as main surface MP of silicon carbide semiconductor layer 100.

Figure 5:
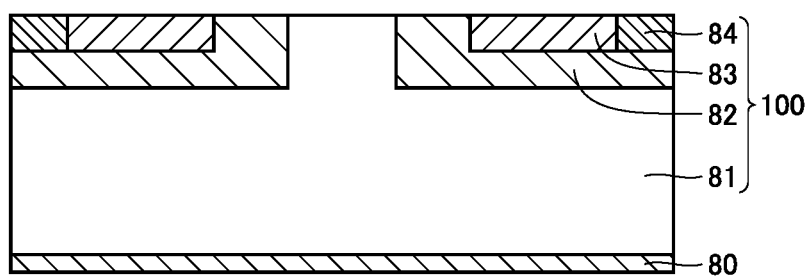
FIG. 5 is a cross sectional view schematically showing a portion of the process for manufacturing the silicon carbide semiconductor device in one embodiment of the present invention.

Next, referring to FIG. 5, p body layer 82, n+ layer 83, and p contact region 84 are formed within n drift layer 81. These can be formed, for example, by performing ion implantation on the entire surface of n drift layer 81. In the ion implantation for forming p body layer 82 and p contact region 84, ions of an impurity for imparting p type, for example Al or the like, are implanted. In the ion implantation for forming n+ layer 83, ions of an impurity for imparting n type, for example phosphorus (P) or the like, are implanted. For the ion implantation for each layer and region, an implantation mask (not shown) made of a conventionally known photoresist or the like is used. It should be noted that, instead of ion implantation, epitaxial growth accompanied by addition of impurities may be used.

Next, heat treatment for activating the impurities is performed. Thereby, a desired carrier is generated in each impurity region. The temperature for the heat treatment on this occasion is preferably more than or equal to 1500° C. and less than or equal to 1900° C., and is approximately 1700° C., for example. The time for the heat treatment can be set to approximately 30 minutes, for example. The atmosphere for the heat treatment is preferably an inert gas atmosphere, and is preferably an argon (Ar) atmosphere, for example. Thus, silicon carbide semiconductor layer 100 is prepared.

(Step S2)

Figure 6:
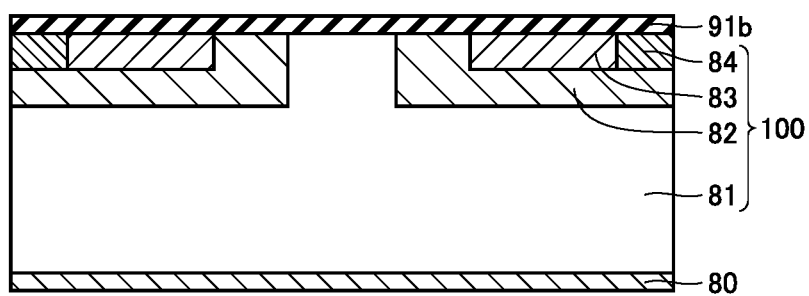
FIG. 6 is a cross sectional view schematically showing a portion of the process for manufacturing the silicon carbide semiconductor device in one embodiment of the present invention.

Step S2 is a step of forming underlying insulating film 91b constituting gate insulating film 91 on silicon carbide semiconductor layer 100. Referring to FIG. 6, underlying insulating film 91b is formed on silicon carbide semiconductor layer 100. Preferably, underlying insulating film 91b is silicon oxide, for example, and is formed by thermally oxidizing silicon carbide semiconductor layer 100. On this occasion, underlying insulating film 91b as a silicon oxide film can be formed by heating silicon carbide semiconductor layer 100 under thermal oxidation conditions of, for example, approximately 1300° C. and an atmosphere containing oxygen ($O_2$).

(Step S3)

In the present embodiment, it is preferable to perform step S3 of introducing at least one of nitrogen and phosphorus into the interface between silicon carbide semiconductor layer 100 and underlying insulating film 91b, after step S2. By performing step S3, dangling bonds are terminated by nitrogen or phosphorus at the interface, and accumulation of an impurity can be prevented. That is, the threshold voltage can be more stabilized.

At least one of nitrogen and phosphorus can be introduced by heat-treating underlying insulating film 91b and silicon carbide semiconductor layer 100 in an atmospheric gas containing atoms thereof. It should be noted that hydrogen may be introduced together with nitrogen and phosphorus on this occasion. That is, step S3 may be a step of introducing at least one of nitrogen, phosphorus, and hydrogen into the interface between silicon carbide semiconductor layer 100 and underlying insulating film 91b.

Examples of a gas containing nitrogen can include nitrogen ($N_2$), nitric oxide (NO), dinitrogen oxide ($N_2O$), nitrogen dioxide ($NO_2$), ammonia ($NH_4$), and the like. Examples of a gas containing phosphorus can include phosphoryl chloride ($POCl_3$), and the like. Examples of a gas containing hydrogen can include hydrogen ($H_2$) and water vapor ($H_2O$). As heat treatment conditions, it is suitable to set the temperature for the heat treatment to more than or equal to approximately 1300° C. and less than or equal to approximately 1500° C. and to set the time for the heat treatment to approximately one hour, for example.

It should be noted that step S3 may be a step in which heat treatment in an atmosphere containing nitrogen, heat treatment in an atmosphere containing phosphorus, and heat treatment in an atmosphere containing hydrogen are sequentially performed individually, or may be a step in which heat treatment using a mixed gas of NO, $POCl_3$, $H_2$ and the like described above is performed.

After step S3, heat treatment using an inert gas may be further performed. Specifically, heat treatment may be further performed in an Ar gas atmosphere. As heat treatment conditions on this occasion, it is preferable to set the temperature for the heat treatment to be higher than the temperature for the heat treatment in step S3, and to be lower than the melting point of underlying insulating film 91b. Further, the time for the heat treatment can be set to approximately one hour, for example. By performing this treatment, dangling bonds are further reduced and the threshold voltage is more stabilized.

(Step S4)

Figure 7:
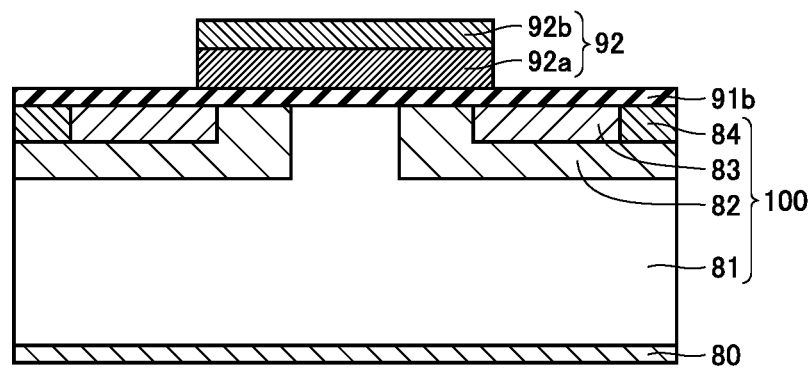
FIG. 7 is a cross sectional view schematically showing a portion of the process for manufacturing the silicon carbide semiconductor device in one embodiment of the present invention.

After underlying insulating film 91b is formed, step S4 of providing gate electrode 92 on underlying insulating film 91b is performed. Referring to FIG. 7, polysilicon layer 92a and electrode layer 92b are laminated in this order on underlying insulating film 91b, for example by a conventionally known CVD method or evaporation method, and thereby gate electrode 92 is formed. That is, in step S4, gate electrode 92 is provided to have polysilicon layer 92a at least at an interface with gate insulating film 91 (underlying insulating film 91b). It should be noted that gate electrode 92 only has to be configured to have a polysilicon layer at least on the side of the interface with gate insulating film 91. Gate electrode 92 may be entirely constituted of a polysilicon layer as described later, or may be constituted of three or more layers as long as it has a polysilicon layer on the side of the interface.

Polysilicon layer 92a may be the one doped with an impurity such as phosphorus, for example. Electrode layer 92b may be any conductor, and is an Al layer, for example. It should be noted that, after gate electrode 92 is formed, chemical mechanical polishing (CMP), reactive ion etching (RIE), or the like may be performed on gate electrode 92.

(Step S5)

Figure 8:
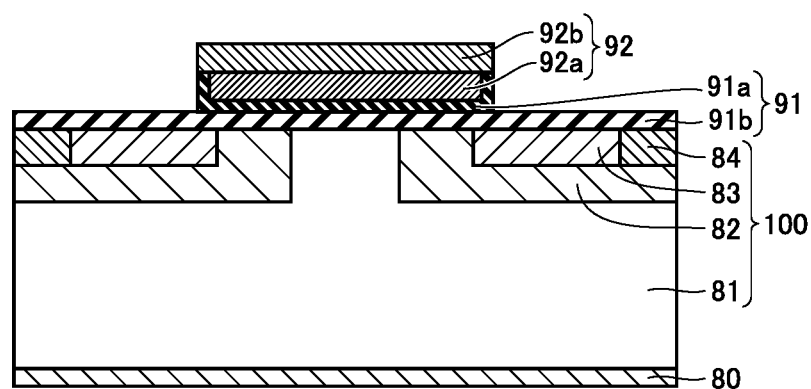
FIG. 8 is a cross sectional view schematically showing a portion of the process for manufacturing the silicon carbide semiconductor device in one embodiment of the present invention.

Referring to FIG. 8, step S5 is performed after step S4. Step S5 is a step of forming oxide film 91a derived from gate electrode 92 (polysilicon layer 92a) and constituting gate insulating film 91, at least at an interface between underlying insulating film 91b and gate electrode 92 (polysilicon layer 92a), by heat-treating gate electrode 92 in an oxygen ($O_2$)-containing atmosphere.

As described above, by undergoing step S4, polysilicon layer 92a is formed on underlying insulating film 91b. Therefore, by thermally oxidizing this polysilicon layer 92a, oxide film 91a which is a clean thermally-oxidized film derived from polysilicon is formed at the interface between underlying insulating film 91b and polysilicon layer 92a.

The temperature for the heat treatment is preferably more than or equal to 700° C. and less than 1100° C., because, when the temperature for the heat treatment is less than 700° C., polysilicon may not be fully oxidized, and when the temperature for the heat treatment is more than or equal to 1100° C., the silicon carbide semiconductor layer may also be oxidized. The time for the heat treatment is, for example, more than or equal to approximately one hour and less than or equal to approximately two hours.

Further, as the atmospheric gas used for the heat treatment, a gas containing an oxygen atom in a molecule can be used instead of oxygen ($O_2$). Examples of such a gas can include NO, $N_2O$, $H_2O$, and the like. These atmospheric gases may be used alone or as a mixed gas.

By forming oxide film 91a as described above, dangling bonds are reduced at the interface between gate electrode 92 and gate insulating film 91 when compared with a conventional case, and the threshold voltage of the silicon carbide semiconductor device can be stabilized.

(Subsequent Steps)

Hereinafter, subsequent steps will be described with reference to FIG. 9. First, interlayer insulating film 93 is formed to cover exposed surfaces of gate electrode 92 (polysilicon layer 92a and electrode layer 92b) and oxide film 91a. Next, etching is performed to form an opening in interlayer insulating film 93 and underlying insulating film 91b. Through this opening, each of n+ layer 83 and p contact region 84 is exposed. Then, source electrode 94 is formed in contact with each of exposed n+ layer 83 and p contact region 84. Further, drain electrode 98 is formed on a lower surface of single crystal substrate 80 opposite to main surface MP. Then, referring to FIG. 1 again, source interconnection layer 95 is formed on source electrode 94.

Thus, the silicon carbide semiconductor device in accordance with the present embodiment having a stable threshold voltage can be manufactured.

<First Modification>

Figure 2:
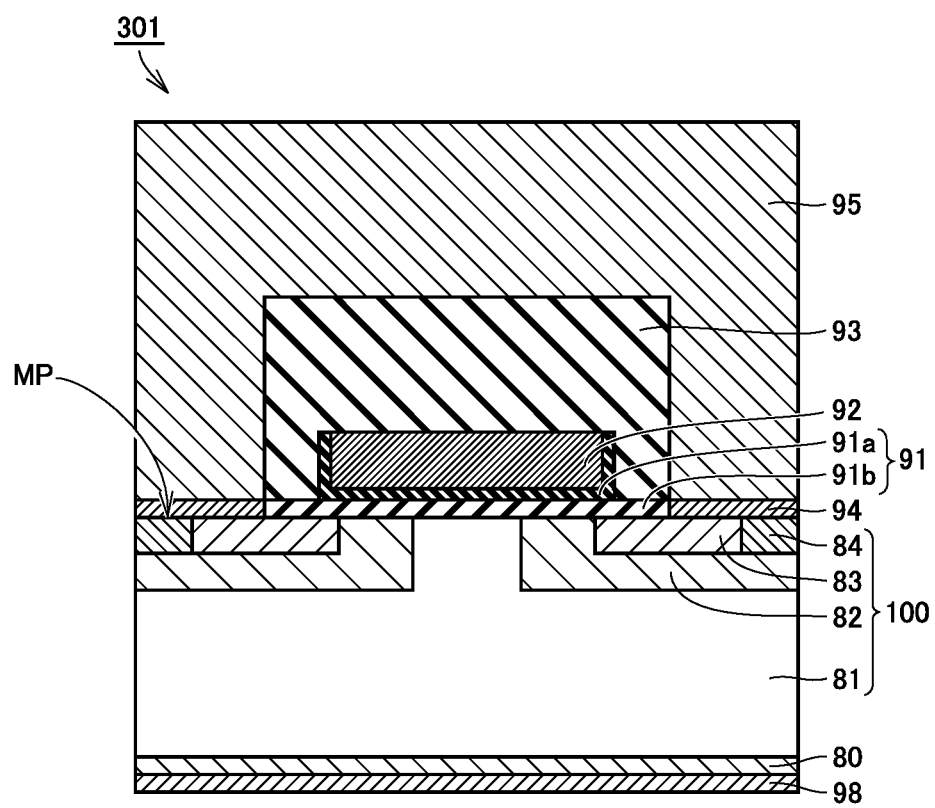
FIG. 2 is a cross sectional view schematically showing an example of the configuration of the silicon carbide semiconductor device in one embodiment of the present invention.

Next, a modification of the present embodiment will be described. A silicon carbide semiconductor device 301 shown in FIG. 2 is a first modification of the present embodiment, and is configured as a vertical MOSFET having a planar structure, as with silicon carbide semiconductor device 201 shown in FIG. 1.

Silicon carbide semiconductor device 301 is different from silicon carbide semiconductor device 201 in that gate electrode 92 is constituted of a polysilicon layer. That is, in silicon carbide semiconductor device 301, gate electrode 92 is substantially entirely a polysilicon layer. Here, the expression "substantially entirely a polysilicon layer" means that a polysilicon layer accounts for 80% or more of the volume of gate electrode 92. It should be noted that, even if gate electrode 92 partially contains a substance different from a polysilicon layer, at least a portion of gate electrode 92 on the side of the interface with gate insulating film 91 should be constituted of a polysilicon layer.

Since silicon carbide semiconductor device 301 also has oxide film 91a derived from the polysilicon layer at the interface between gate insulating film 91 and gate electrode 92, silicon carbide semiconductor device 301 can have a stable threshold voltage. Further, since gate electrode 92 is entirely constituted of the polysilicon layer, a manufacturing process can be simplified.

<Second Modification>

Figure 3:
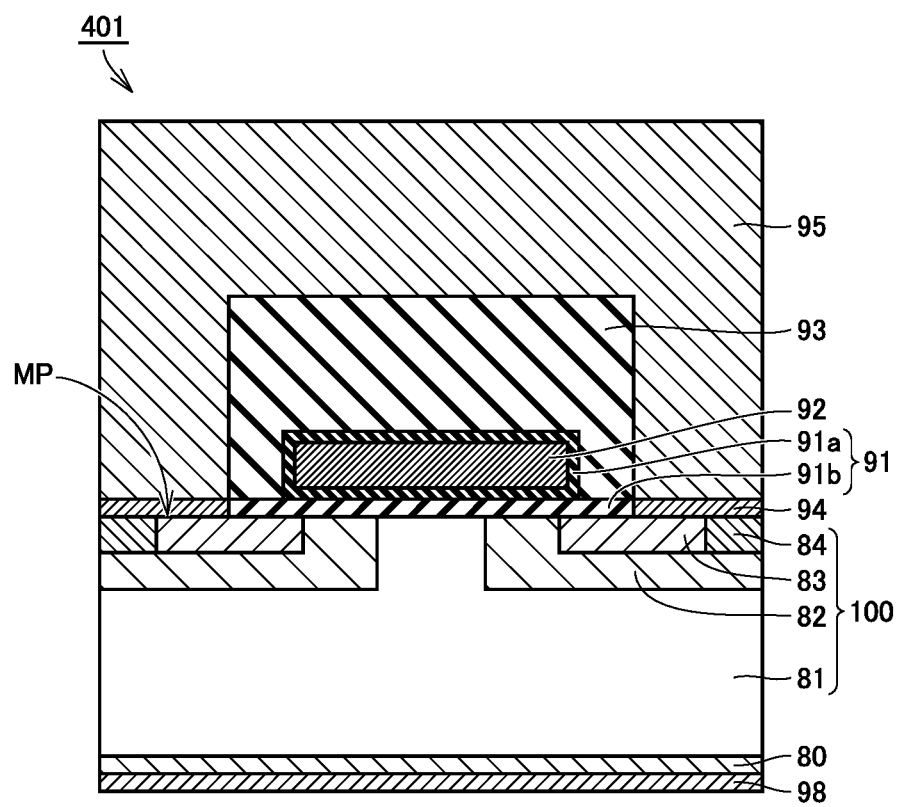
FIG. 3 is a cross sectional view schematically showing an example of the configuration of the silicon carbide semiconductor device in one embodiment of the present invention.

A silicon carbide semiconductor device 401 shown in FIG. 3 is a second modification of the present embodiment. Silicon carbide semiconductor device 401 is different from silicon carbide semiconductor device 301 shown in FIG. 2 in that oxide film 91a extends onto a side surface and an upper surface of gate electrode 92. Such a configuration is easily implemented by causing gate electrode 92 to be substantially entirely constituted of a polysilicon layer.

Since silicon carbide semiconductor device 401 also has oxide film 91a derived from the polysilicon layer at the interface between gate insulating film 91 and gate electrode 92, silicon carbide semiconductor device 401 can have a stable threshold voltage. Further, since oxide film 91a extends onto the side surface and the upper surface of gate electrode 92, silicon carbide semiconductor device 401 can have oxide film 91a, which is a clean thermally-oxidized film, also at an interface between interlayer insulating film 93 and gate electrode 92. Thereby, also at that interface, accumulation of an impurity is prevented, and the threshold voltage can be further stabilized. It should be noted that, from the same viewpoint, it is more preferable that oxide film 91a covers the entire surface of gate electrode 92.

<Third Modification>

Figure 10:
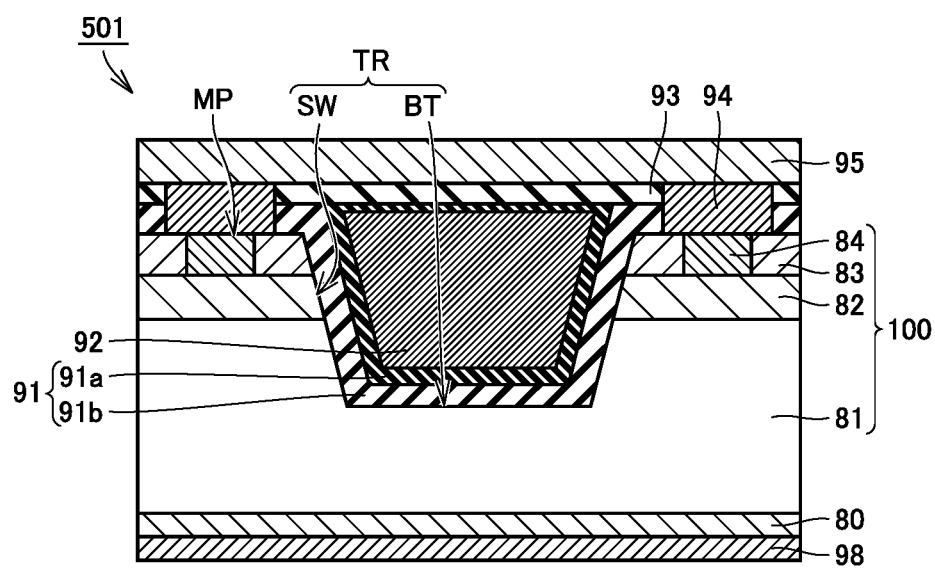
FIG. 10 is a cross sectional view schematically showing an example of the configuration of the silicon carbide semiconductor device in one embodiment of the present invention.

A silicon carbide semiconductor device 501 shown in FIG. 10 is a third modification of the present embodiment. Silicon carbide semiconductor device 501 is configured as a vertical MOSFET having a trench gate structure. Silicon carbide semiconductor device 501 includes single crystal substrate 80, silicon carbide semiconductor layer 100 (epitaxial layer), gate insulating film 91, gate electrode 92, interlayer insulating film 93, source electrode 94, source interconnection layer 95, and drain electrode 98.

Silicon carbide semiconductor layer 100 has main surface MP, and includes the first impurity region (n drift layer 81)

having n type (the first conductivity type), the second impurity region (p body layer 82) having p type (the second conductivity type), the third impurity region (n+ layer 83) having n type, and p contact region 84 having p type.

Here, as shown in FIG. 10, p body layer 82 is provided within n drift layer 81. Further, n+ layer 83 and p contact region 84 are provided within p body layer 82. In addition, n+ layer 83 and p contact region 84 constitute a portion of main surface MP.

Trench TR is formed in main surface MP of silicon carbide semiconductor layer 100. Trench TR has a bottom portion BT at which n drift layer 81 is exposed, and sidewall SW at which n drift layer 81, p body layer 82, and n+ layer 83 are exposed. Gate insulating film 91 (oxide film 91a and underlying insulating film 91b) is formed on bottom portion BT and sidewall SW of trench TR. Here, oxide film 91a is an oxide film derived from gate electrode 92. Further, within trench TR, gate electrode 92 constituted of a polysilicon layer is formed on oxide film 91a. Thereby, a channel region is formed along p body layer 82 exposed at sidewall SW.

Source electrode 94 is provided on n+ layer 83 and p contact region 84 to be in contact with each of n+ layer 83 and p contact region 84. Further, interlayer insulating film 93 is formed above gate electrode 92 to cover gate insulating film 91 (oxide film 91a and underlying insulating film 91b). Furthermore, source interconnection layer 95 is formed on interlayer insulating film 93 and source electrode 94 to be in contact therewith. Drain electrode 98 is provided on the lower surface of silicon carbide semiconductor layer 100 opposite to main surface MP, with single crystal substrate 80 interposed therebetween.

As described above, also in silicon carbide semiconductor device 501, gate electrode 92 has a polysilicon layer at least on a side of the interface with gate insulating film 91, and gate insulating film 91 has oxide film 91a derived from the polysilicon layer at the interface between gate insulating film 91 and gate electrode 92 (polysilicon layer). That is, silicon carbide semiconductor device 501 is a silicon carbide semiconductor device having a trench gate structure, having reduced dangling bonds at the interface between gate insulating film 91 and gate electrode 92, and having a stable threshold voltage.

Figure 11:
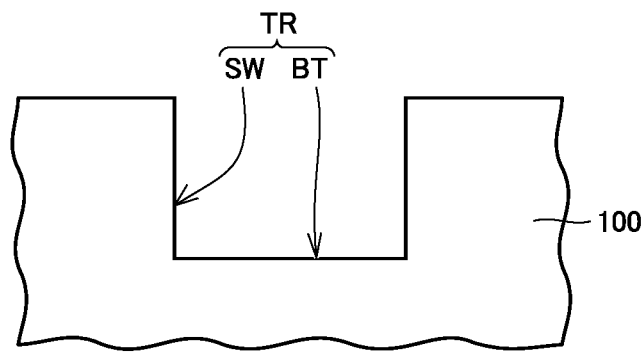
FIG. 11 is a view schematically showing an example of a cross sectional shape of a trench in accordance with one embodiment of the present invention.
Figure 12:
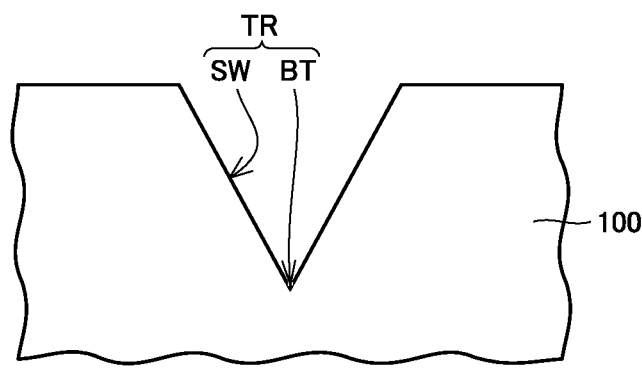
FIG. 12 is a view schematically showing an example of the cross sectional shape of the trench in accordance with one embodiment of the present invention.
Figure 13:
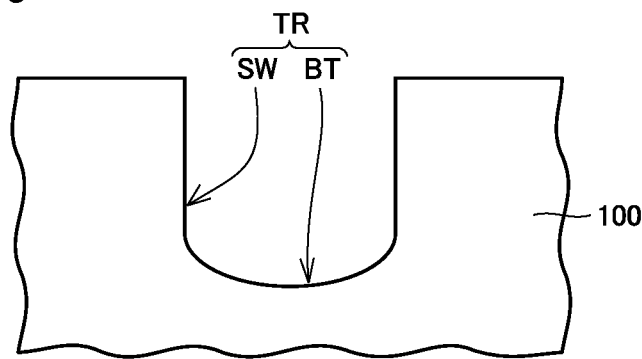
FIG. 13 is a view schematically showing an example of the cross sectional shape of the trench in accordance with one embodiment of the present invention.

Although trench TR has been described in the third modification as a trench having inclined sidewall SW and bottom portion BT as a flat surface, and having a trapezoidal cross sectional shape, the cross sectional shape of trench TR is not limited thereto, and may be, for example, a rectangular shape as shown in FIG. 11, or a V shape as shown in FIG. 12. Alternatively, the cross sectional shape of trench TR may be a U shape in which bottom portion BT is not a flat surface, as shown in FIG. 13.

Although the silicon carbide semiconductor device in accordance with the present embodiment has been described above, taking a MOSFET as an example, the present embodiment is not limited thereto, and the silicon carbide semiconductor device may be an IGBT (Insulated Gate Bipolar Transistor) or the like, for example. Also when it is an IGBT, it exhibits the same effect as that described above.

EXAMPLE

Hereinafter, the present embodiment will be described in more detail, using an example. However, the present embodiment is not limited thereto.

Example

A silicon carbide semiconductor device A in accordance with an example was manufactured as described below.

(Step S1)

First, single crystal substrate 80 made of a SiC single crystal and having a thickness of 300 μm was prepared. Single crystal substrate 80 had an off angle of 4° relative to a (0001) plane.

Next, referring to FIG. 4, 15 μm-thick silicon carbide semiconductor layer 100 (n drift layer 81) was grown on single crystal substrate 80 by the CVD method using a mixed gas of $SiH_4$ and $C_3H_8$ as a source gas and $H_2$ as a carrier gas.

Next, referring to FIG. 5, p body layer 82, n+ layer 83, and p contact region 84 were formed within n drift layer 81 by ion implantation using an implantation mask (not shown). The concentration of an impurity (a donor or an acceptor) in each layer or region was as follows: n drift layer 81 (N concentration: $7 \times 10^{15}/cm^3$); p body layer 82 (Al concentration: $5 \times 10^{16}/cm^3$); the n+ layer (P concentration: $2 \times 10^{19}/cm^3$); and the p contact region (Al concentration: $7 \times 10^{19}/cm^3$). Subsequently, the implanted impurities were activated by performing heat treatment at 1700° C. for 30 minutes in an Ar atmosphere. Thus, silicon carbide semiconductor layer 100 was prepared.

(Step S2)

Next, referring to FIG. 6, 45 nm-thick underlying insulating film 91b, which was a $SiO_2$ film derived from silicon carbide semiconductor layer 100, was formed by heat-treating silicon carbide semiconductor layer 100 at 1300° C. for one hour in an atmosphere containing $O_2$.

(Step S3)

Subsequently, nitrogen was introduced into an interface between silicon carbide semiconductor layer 100 and underlying insulating film 91b by performing heat treatment at 1400° C. for one hour in an atmosphere containing NO. When nitrogen concentration in a region within 10 nm from the interface between silicon carbide semiconductor layer 100 and underlying insulating film 91b was measured with a SIMS, the nitrogen concentration was more than or equal to $1 \times 10^{21}/cm^3$.

(Step S4)

Next, referring to FIG. 7, gate electrode 92 including 300 nm-thick polysilicon layer 92a and a 100 nm-thick Al layer (electrode layer 92b) was formed on underlying insulating film 91b by the CVD method.

(Step S5)

Subsequently, referring to FIG. 8, 10 nm-thick oxide film 91a was formed by thermally oxidizing polysilicon layer 92a by the thickness of 5 nm. On this occasion, thermal oxidation was performed at 900° C. for one hour in an atmosphere containing $O_2$.

Figure 9:
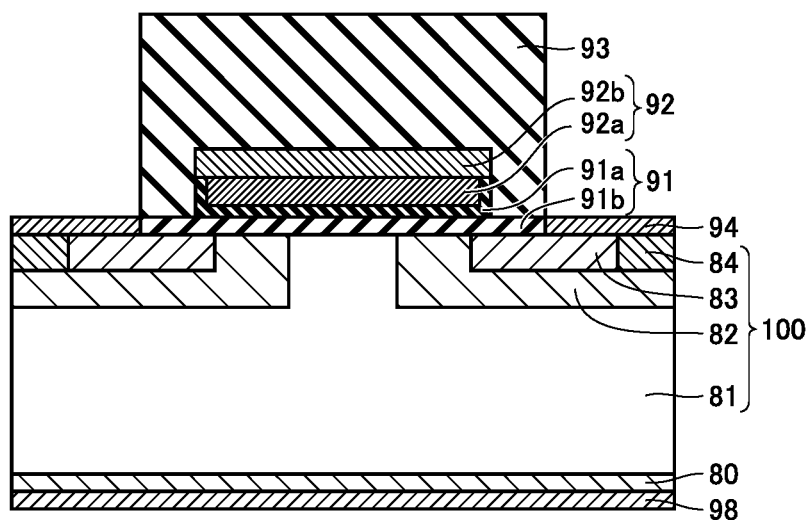
FIG. 9 is a cross sectional view schematically showing a portion of the process for manufacturing the silicon carbide semiconductor device in one embodiment of the present invention.

Thereafter, referring to FIGS. 9 and 1, silicon carbide semiconductor device A in accordance with the example was obtained by forming interlayer insulating film 93, source electrode 94, source interconnection layer 95, and drain electrode 98. It should be noted that, in silicon carbide semiconductor device A, a portion of gate insulating film 91 in contact with polysilicon layer 92a was constituted of 40 nm-thick underlying insulating film 91b and 10 nm-thick oxide film 91a, and had a thickness of 50 nm in total.

Comparative Example

A silicon carbide semiconductor device B in accordance with a comparative example was manufactured in the same way as silicon carbide semiconductor device A, except that a 50 nm-thick underlying insulating film was formed in step S2, and steps S3 and S5 were not performed. That is, in silicon carbide semiconductor device B in accordance with the comparative example, a gate insulating film (thickness: 50 nm) was constituted of only a silicon oxide film derived from a silicon carbide semiconductor layer, and nitrogen was not introduced into an interface between the gate insulating film and the silicon carbide semiconductor layer.

<Evaluation>

Silicon carbide semiconductor devices A and B obtained as described above were evaluated as described below.

(Measurement of Sodium Concentration)

First, distribution of an impurity (Na) concentration between gate electrode 92 and silicon carbide semiconductor layer 100 in each silicon carbide semiconductor device was measured with a SIMS. Measurement results are shown in FIG. 14.

Figure 14:
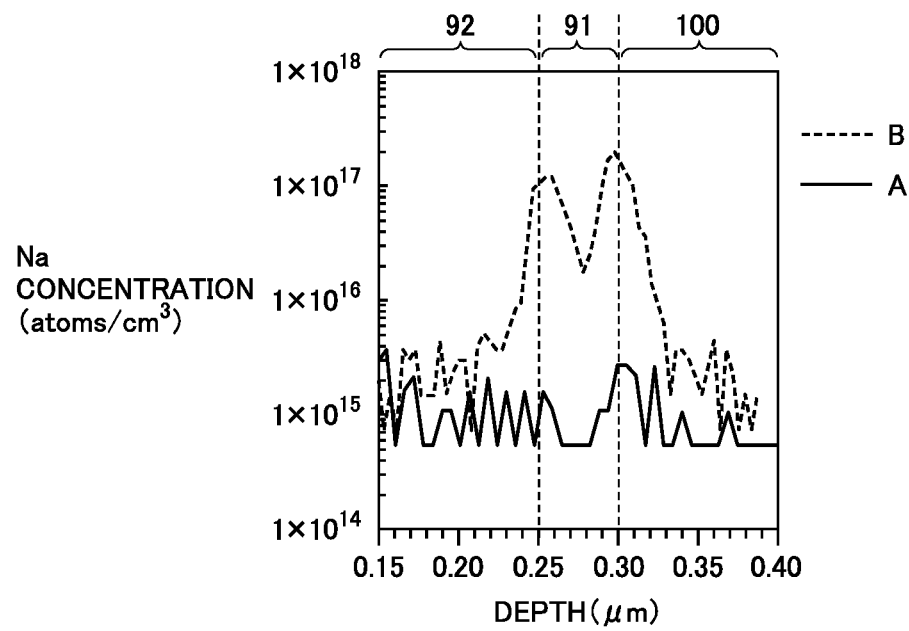
FIG. 14 is a graph showing an example of results of measuring sodium concentration by secondary ion mass spectrometry in the silicon carbide semiconductor device in accordance with one embodiment of the present invention.

FIG. 14 is a graph showing distribution of Na concentration in the region from gate electrode 92 through gate insulating film 91 to silicon carbide semiconductor layer 100 in each silicon carbide semiconductor device. In FIG. 14, the axis of abscissas is an axis representing the depth of a measurement object position from a reference point (for example, a position in a vertical direction in FIG. 1 and the like), and the axis of ordinates is a logarithmic axis representing the Na concentration (unit: atoms/cm$^3$) at the measurement object position. Here, a region at a depth of more than or equal to 0.15 µm and less than 0.25 µm corresponds to gate electrode 92 (polysilicon layer), a region at a depth of more than or equal to 0.25 µm and less than or equal to 0.30 µm corresponds to gate insulating film 91 (oxide film 91a and underlying insulating film 91b), and a region at a depth of more than 0.30 µm corresponds to silicon carbide semiconductor layer 100. Further, in FIG. 14, the solid line represents the measurement result in silicon carbide semiconductor device A in accordance with the example, and the dotted line represents the measurement result in silicon carbide semiconductor device B in accordance with the comparative example. It should be noted that, in FIG. 14, one division on the axis of abscissas represents 0.01 µm (10 nm).

As shown in FIG. 14, in silicon carbide semiconductor device A in accordance with the example, the Na concentration is less than or equal to $1 \times 10^{16}$/cm$^3$ in the entire region at a depth of more than or equal to 0.15 µm and less than or equal to 0.40 µm. In particular, the Na concentration in a region within ±10 nm from the interface between gate electrode 92 and gate insulating film 91 (oxide film 91a) (in FIG. 14, a position at a depth of 0.25 µm) is less than or equal to $1 \times 10^{16}$/cm$^3$. This is thought to be because oxide film 91a derived from the polysilicon layer was formed in silicon carbide semiconductor device A in accordance with the example, and thereby an impurity was less likely to accumulate around this interface.

In contrast, in silicon carbide semiconductor device B in accordance with the comparative example, the Na concentration exhibits a high peak more than $1 \times 10^{17}$/cm$^3$ in the vicinity of the depth of 0.25 µm (that is, in the vicinity of the interface between the gate electrode and the gate insulating film). This is thought to be because a large amount of dangling bonds existed in the vicinity of the interface between the gate electrode and the gate insulating film (in particular, in a region within ±10 nm from the interface), and Na as an impurity was trapped by the dangling bonds.

Next, the interface between gate insulating film 91 and silicon carbide semiconductor layer 100 will be considered. The interface corresponds to a position at a depth of 0.30 µm in FIG. 14. In silicon carbide semiconductor device A in accordance with the example, the Na concentration in a region within ±10 nm from the interface is less than or equal to $1 \times 10^{16}$/cm$^3$. This is thought to be because nitrogen was introduced into the interface between gate insulating film 91 (underlying insulating film 91b) and silicon carbide semiconductor layer 100, and thereby dangling bonds around the interface were terminated, and the impurity (Na) was less likely to accumulate.

In contrast, in silicon carbide semiconductor device B in accordance with the comparative example, the Na concentration exhibits a high peak more than $1 \times 10^{17}$/cm$^3$ in the vicinity of the depth of 0.30 µm. This is thought to be because a large amount of dangling bonds existed in the vicinity of the interface between the gate insulating film and the silicon carbide semiconductor layer (in particular, in a region within ±10 nm from the interface), and Na as an impurity was trapped by the dangling bonds.

Further, what is remarkable among the above results is that, in silicon carbide semiconductor device A in accordance with the example, the Na concentration is less than or equal to $1 \times 10^{16}$/cm$^3$ in the entire region of gate insulating film 91 (that is, the region at a depth of more than or equal to 0.25 µm and less than or equal to 0.30 µm). The reason why the Na concentration in gate insulating film 91 was less than or equal to $1 \times 10^{16}$/cm$^3$ as described above can be thought to be because accumulation of Na was prevented at both the interface between gate electrode 92 and gate insulating film 91 and the interface between gate insulating film 91 and silicon carbide semiconductor layer 100, which are portions where an impurity is particularly likely to accumulate as described above, and thereby the amount of Na which existed in a region sandwiched between these interfaces was also reduced.

(Durability Test)

Next, stability of the threshold voltage of each silicon carbide semiconductor device was evaluated by a continuous operation test (durability test) at a high temperature. That is, a gate voltage of −10V was continuously applied to each silicon carbide semiconductor device under an environment of 150° C., to measure a threshold voltage variation amount. Measurement results are shown in FIG. 15.

Figure 15:
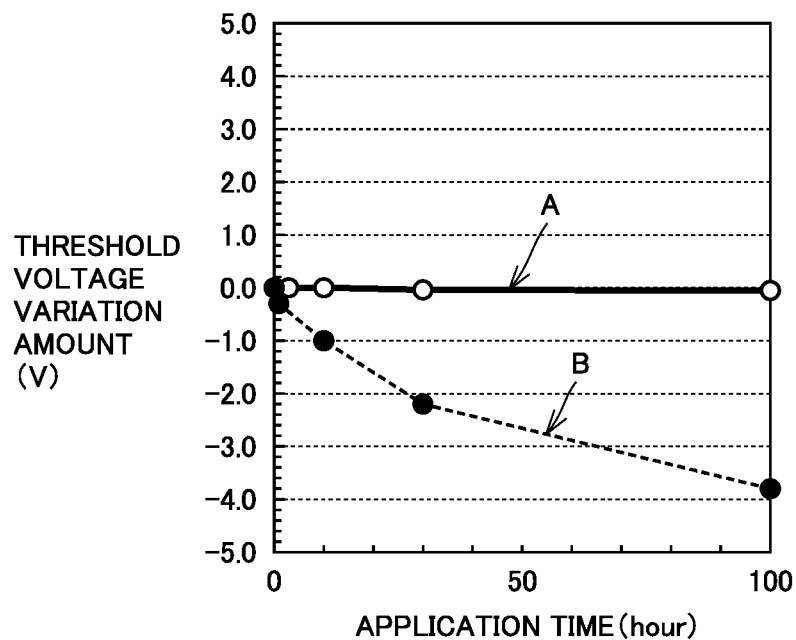
FIG. 15 is a graph showing an example of the relation between gate voltage application time and threshold voltage variation amount in the silicon carbide semiconductor device in accordance with one embodiment of the present invention.

FIG. 15 is a graph showing the relation between gate voltage application time (unit: hour) and threshold voltage variation amount (unit: V) in the durability test. In FIG. 15, legends expressed by white circles and the solid line represent the measurement result in silicon carbide semiconductor device A in accordance with the example, and legends expressed by black circles and the dotted line represent the measurement result in silicon carbide semiconductor device B in accordance with the comparative example.

As shown in FIG. 15, in silicon carbide semiconductor device B in accordance with the comparative example, the threshold voltage decreased from the start of the test, and after a lapse of 100 hours, the threshold voltage shifted from the original threshold voltage to the minus side by nearly 4 V.

In contrast, in silicon carbide semiconductor device A in accordance with the example, the threshold voltage continued to be substantially constant from the start of the test, and the variation amount thereof was substantially zero even after a lapse of 100 hours. The reason why such a result was obtained is thought to be because, in silicon carbide semiconductor device A in accordance with the example, the impurity (Na) concentration was less than or equal to $1 \times 10^{16}$/cm$^3$ in the region from the gate electrode to the silicon carbide semiconductor layer.

From the above evaluation results, it was confirmed that the silicon carbide semiconductor device in accordance with the example, including silicon carbide semiconductor layer 100, gate insulating film 91 formed on silicon carbide semiconductor layer 100, and gate electrode 92 provided on gate insulating film 91, wherein gate electrode 92 has polysilicon layer 92a at least on a side of an interface with gate insulating film 91, and gate insulating film 91 has oxide film 91a derived from polysilicon layer 92a, at an interface between gate insulating film 91 and polysilicon layer 92a of gate electrode 92, is a silicon carbide semiconductor device having a stable threshold voltage.

Further, the silicon carbide semiconductor device in accordance with the example includes silicon carbide semiconductor layer 100, gate insulating film 91 formed on silicon carbide semiconductor layer 100, and gate electrode 92 provided on gate insulating film 91, wherein sodium concentration in gate insulating film 91 is less than or equal to $1\times10^{16}/cm^3$, and thus is a silicon carbide semiconductor device having a stable threshold voltage.

Although the embodiment and the example of the present invention have been described above, it is also originally intended to combine the configurations of the embodiment, the modifications, and the example described above, as appropriate. It should be understood that the embodiment disclosed herein is illustrative and non-restrictive in every respect. The scope of the present invention is defined by the scope of the claims, rather than the description above, and is intended to include any modifications within the scope and meaning equivalent to the scope of the claims.

REFERENCE SIGNS LIST

80: single crystal substrate; 81: n drift layer (the first impurity region); 82: p body layer (the second impurity region); 83: n+ layer (the third impurity region); 84: p contact region; 91: gate insulating film; 91a: oxide film; 91b: underlying insulating film; 92: gate electrode; 92a: polysilicon layer; 92b: electrode layer; 93: interlayer insulating film; 94: source electrode; 95: source interconnection layer; 98: drain electrode; 100: silicon carbide semiconductor layer; 201, 301, 401, 501: silicon carbide semiconductor device; MP: main surface; TR: trench; BT: bottom portion; SW: sidewall

The invention claimed is:

1. A silicon carbide semiconductor device, comprising:
    a silicon carbide semiconductor layer;
    a gate insulating film formed on the silicon carbide semiconductor layer; and
    a gate electrode provided on the gate insulating film, wherein
    the gate electrode has a polysilicon layer at least on a side of an interface with the gate insulating film,
    the gate insulating film includes an underlying insulating film derived from the silicon carbide semiconductor layer and an oxide film derived from the polysilicon layer,
    the oxide film is disposed at an interface between the gate insulating film and the polysilicon layer of the gate electrode, and
    the oxide film is thinner than the underlying insulating film.

2. The silicon carbide semiconductor device according to claim 1, wherein the oxide film has a thickness of less than or equal to 50 nm.

3. The silicon carbide semiconductor device according to claim 1, wherein the gate electrode is constituted of the polysilicon layer.

4. The silicon carbide semiconductor device according to claim 1, wherein the oxide film extends onto a side surface and an upper surface of the gate electrode.

5. The silicon carbide semiconductor device according to claim 1, wherein
    the silicon carbide semiconductor layer has a main surface, and includes
        a first impurity region having a first conductivity type,
        a second impurity region provided within the first impurity region and having a second conductivity type different from the first conductivity type, and
        a third impurity region constituting a portion of the main surface, provided within the second impurity region, and having the first conductivity type,
    the main surface is provided with a trench in which the second impurity region and the third impurity region are exposed at a sidewall, and
    the gate insulating film is formed on the sidewall.

6. The silicon carbide semiconductor device according to claim 1, wherein
    the silicon carbide semiconductor layer has a main surface, and includes
        a first impurity region constituting a portion of the main surface and having a first conductivity type,
        a second impurity region constituting a portion of the main surface, provided within the first impurity region, and having a second conductivity type different from the first conductivity type, and
        a third impurity region constituting a portion of the main surface, provided within the second impurity region, and having the first conductivity type, and
    the gate insulating film is formed on the main surface constituted of the second impurity region.

7. The silicon carbide semiconductor device according to claim 1, wherein sodium concentration in a region within 10 nm from the interface between the gate electrode and the gate insulating film is less than or equal to $1\times10^{16}/cm^3$.

8. The silicon carbide semiconductor device according to claim 1, wherein nitrogen concentration in a region within 10 nm from an interface between the silicon carbide semiconductor layer and the gate insulating film is more than or equal to $1\times10^{21}/cm^3$.

9. A method for manufacturing a silicon carbide semiconductor device, comprising the steps of:
    preparing a silicon carbide semiconductor layer;
    forming an underlying insulating film constituting a gate insulating film on the silicon carbide semiconductor layer;
    providing a gate electrode on the underlying insulating film; and
    forming an oxide film derived from the gate electrode and constituting the gate insulating film, at least at an interface between the underlying insulating film and the gate electrode, by heat-treating the gate electrode in an oxygen-containing atmosphere, wherein
    the underlying insulating film is derived from the silicon carbide semiconductor layer, and
    the oxide film is thinner than the underlying insulating film.

10. The method for manufacturing the silicon carbide semiconductor device according to claim 9, wherein, in the step of providing the gate electrode, the gate electrode is provided to have a polysilicon layer at least at an interface with the gate insulating film.

11. The method for manufacturing the silicon carbide semiconductor device according to claim 9, further comprising the step of introducing at least one of nitrogen and phosphorus into an interface between the silicon carbide semiconductor layer and the underlying insulating film.

* * * * *